United States Patent
Poddar et al.

(10) Patent No.: US 11,955,456 B2
(45) Date of Patent: Apr. 9, 2024

(54) FLIP CHIP PACKAGED DEVICES WITH THERMAL PAD

(71) Applicant: Texas Instruments Incorporated, Dallas, TX (US)

(72) Inventors: Anindya Poddar, Sunnyvale, CA (US); Ashok Surendra Prabhu, San Jose, CA (US); Hau Nguyen, San Jose, CA (US); Kurt Edward Sincerbox, San Jose, CA (US); Makoto Shibuya, Tokyo (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/364,735

(22) Filed: Jun. 30, 2021

(65) Prior Publication Data

US 2023/0005880 A1    Jan. 5, 2023

(51) Int. Cl.
*H01L 23/00* (2006.01)
*H01L 21/48* (2006.01)
*H01L 21/56* (2006.01)
*H01L 23/31* (2006.01)
*H01L 23/367* (2006.01)
(Continued)

(52) U.S. Cl.
CPC .......... *H01L 24/94* (2013.01); *H01L 21/4825* (2013.01); *H01L 21/4839* (2013.01); *H01L 21/563* (2013.01); *H01L 23/3157* (2013.01); *H01L 23/367* (2013.01); *H01L 23/49861* (2013.01); *H01L 24/11* (2013.01); *H01L 24/16* (2013.01); *H01L 25/0655* (2013.01); *H01L 24/97* (2013.01); *H01L 2224/11849* (2013.01); *H01L 2224/13111* (2013.01); *H01L 2224/13116* (2013.01); *H01L 2224/13139* (2013.01); *H01L 2224/13147* (2013.01); *H01L 2224/16245* (2013.01); *H01L 2924/182* (2013.01)

(58) Field of Classification Search
None
See application file for complete search history.

(56) References Cited

U.S. PATENT DOCUMENTS

| 2011/0221047 A1* | 9/2011 | Yang ................. H01L 23/49572 257/E23.033 |
| 2013/0161803 A1* | 6/2013 | Briere ............... H01L 23/49568 257/675 |
| 2019/0333811 A1* | 10/2019 | Wu ...................... H01L 23/5389 |

FOREIGN PATENT DOCUMENTS

JP         2017139316 A  *  8/2017  ......... H01L 21/4857

* cited by examiner

*Primary Examiner* — Hung K Vu
(74) *Attorney, Agent, or Firm* — Dawn Jos; Frank D. Cimino

(57) ABSTRACT

In a described example, an apparatus includes: a first package substrate having a die mount surface; a semiconductor die flip chip mounted to the first package substrate on the die mount surface, the semiconductor die having post connects having proximate ends on bond pads on an active surface of the semiconductor die, and extending to distal ends away from the semiconductor die having solder bumps, wherein the solder bumps form solder joints to the package substrate; a second package substrate having a thermal pad positioned with the thermal pad over a backside surface of the semiconductor die, the thermal pad comprising a thermally conductive material; and a mold compound covering a portion of the first package substrate, a portion of the second package substrate, the semiconductor die, and the post connects, thermal pad having a surface exposed from the mold compound.

19 Claims, 15 Drawing Sheets

(51) Int. Cl.
*H01L 23/498* (2006.01)
*H01L 25/065* (2023.01)

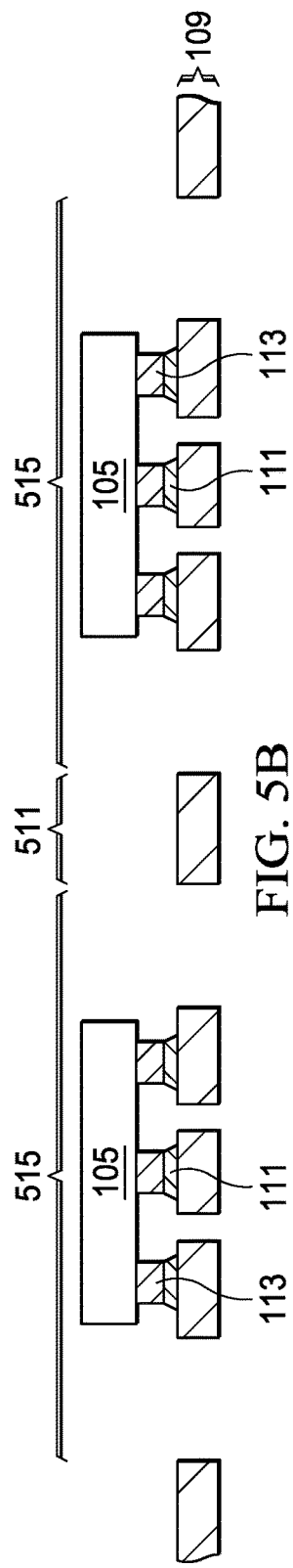
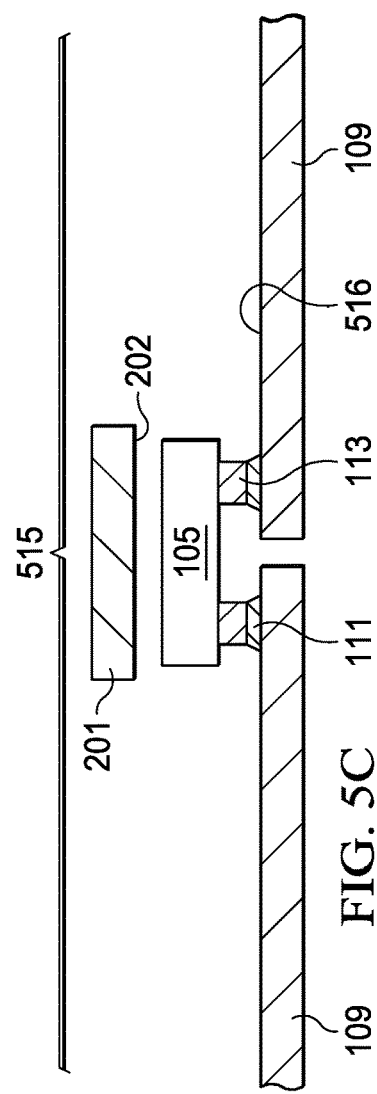
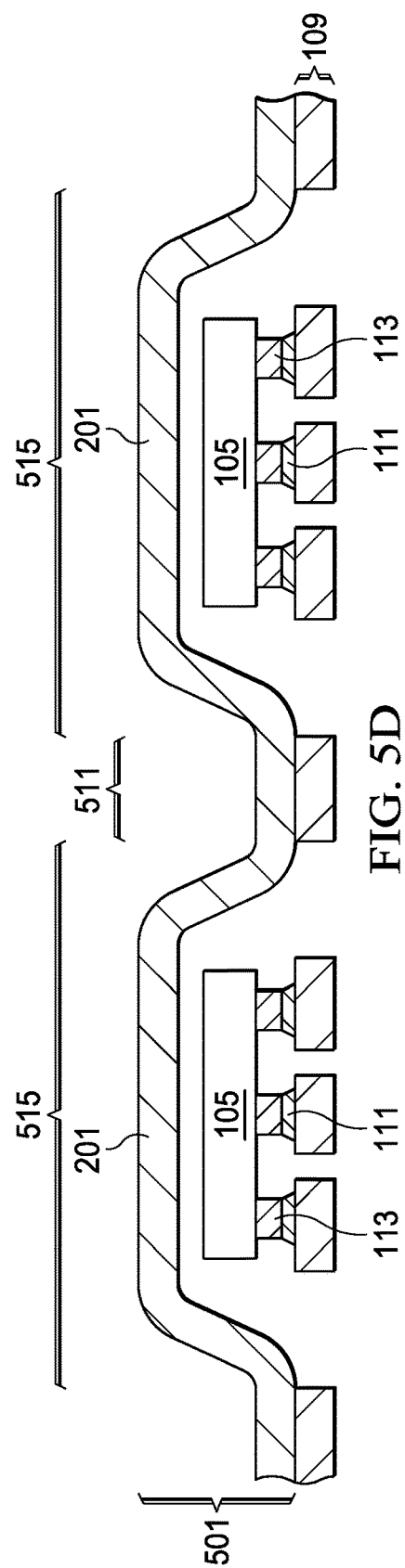
FIG. 5B
FIG. 5C
FIG. 5D

FLIP CHIP PACKAGED DEVICES WITH THERMAL PAD

TECHNICAL FIELD

This relates generally to packaging electronic devices, and more particularly to flip chip mounted dies in molded device packages.

BACKGROUND

Processes for producing packaged electronic devices include mounting the electronic devices to a package substrate, and covering the electronic devices with mold compounds to form packages. The molding processes may be done on single devices or may be done on multiple electronic devices simultaneously. The devices may be arranged in a strip of devices adjacent to one another, or in a two dimensional array of devices in rows and columns on a package substrate, such as lead frame strips or arrays. Once the packages are complete, the devices are separated from one another. In one method to separate the devices from one another, a saw is used. The saw cuts through the mold compound and through the package substrate materials along saw streets defined between the electronic devices, to separate the devices. Other cutting tools such as lasers can be used.

Small outline transistor (SOT) packages are used when a device has a few terminals, such as a power transistor device, a sensor, or an analog device. Flip-chip mounted semiconductor devices can be used to form an SOT package. Flip chip mounting to a lead frame (FCOL) replaces wire bonded, face up packages and can reduce problems associated with bond wires. When devices are mounted on package substrates using flip-chip packages, a semiconductor die has conductive post connects that extend from a proximal end placed on bond pads on an active surface of the semiconductor die to a distal end having a solder ball or solder bump. In a flip-chip package the semiconductor die is mounted with the active surface facing the package substrate. When the semiconductor die is flip-chip mounted to the package substrate, the solder bumps at the distal end of the post connects are heated and allowed to reflow to form solder joints that provide a mechanical connection and electrically couple the semiconductor die to the package substrate. The solder joints mount the conductive post connects to a conductive area on the package substrate.

Some semiconductor devices, such as power transistors which deliver power in the form of current or high voltages to a load, generate substantial heat when operating. In an SOT package, the semiconductor die can be isolated from the system board by the mold compound, and by ambient atmosphere, so that the heat from the die is transferred away from the package using the package leads, which is inefficient. To increase performance and power handling capabilities for packaged devices in molded packages, thermal dissipation needs to be increased.

SUMMARY

In a described example, an apparatus includes a first package substrate having a die mount surface; a semiconductor die flip chip mounted to the first package substrate on the die mount surface, the semiconductor die having post connects having proximate ends on bond pads on an active surface of the semiconductor die, and extending to distal ends away from the semiconductor die having solder bumps, wherein the solder bumps form solder joints to the package substrate; a second package substrate having a thermal pad positioned with the thermal pad over a backside surface of the semiconductor die, the thermal pad comprising a thermally conductive material; and a mold compound covering a portion of the first package substrate, a portion of the second package substrate, the semiconductor die, and the post connects, thermal pad having a surface exposed from the mold compound.

BRIEF DESCRIPTION OF THE DRAWINGS

FIGS. 5A-5J illustrate, in a series of cross sectional views and side views, the major steps in manufacturing a flip chip packaged electronic device of the arrangements.

DETAILED DESCRIPTION

Figure 1A:
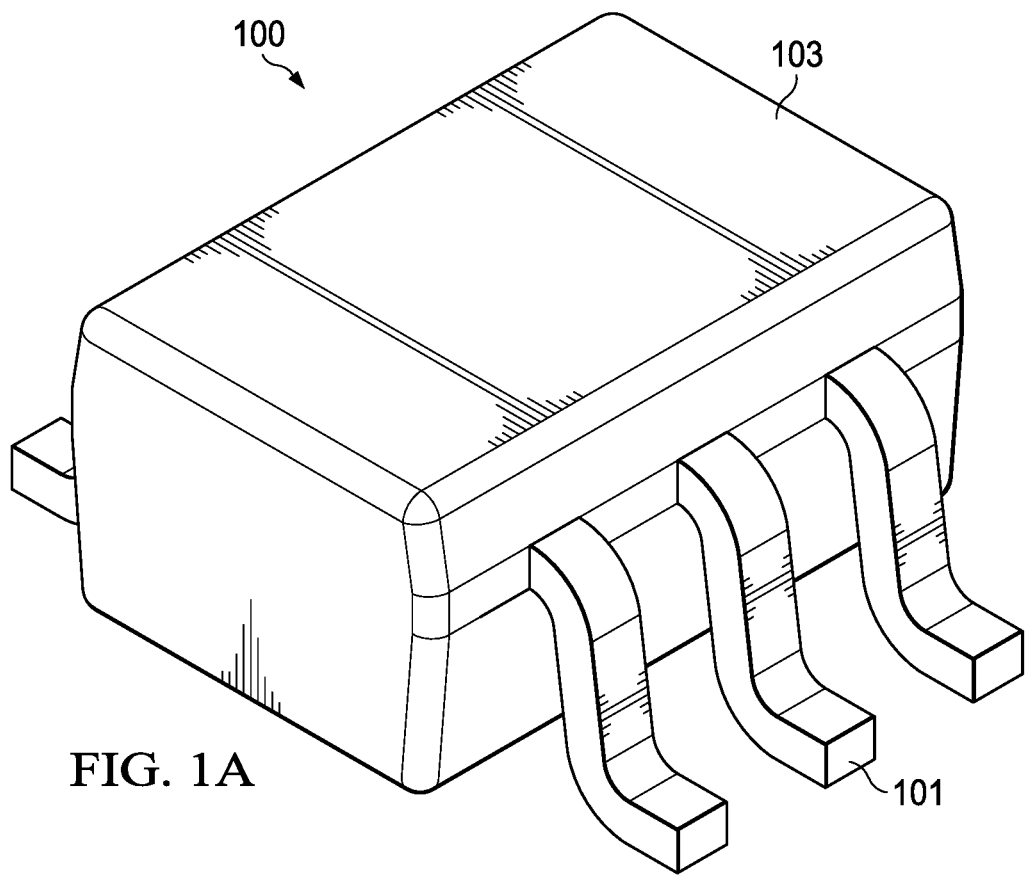
FIGS. 1A-1C illustrate in a projection view, a cross sectional view, and a partially exploded projection view, respectively, a small outline transistor (SOT) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electromechanical system (MEMS) device, such as a digital micromirror device (DMD).

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. Additional components such as passives can be included in the packaged electronic device. The semiconductor die is mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor die can be flip-chip mounted with the active surface facing the substrate surface, and the semiconductor die mounted to the leads of the substrate by conductive post connects carrying solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates useful with the arrangements include conductive lead frames, which can be formed from copper, aluminum, stainless steel and alloys such as Alloy 42 and copper alloys. The lead frames can include a die mounting area for mounting a semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. In wire bonded packages, wire bonds can couple bond pads on the semiconductor dies to the leads of the lead frames. After the wire bonds are in place, a portion of the substrate, the die, and at least a portion of the die pad can be covered with a protective material such as a mold compound. In flip-chip on lead (FCOL) packages, conductive post connects are formed on an active surface of a semiconductor die and extend from bond pads on the active surface as pillars, rails, or posts. The post connects end in a solder bump or solder column portion at the distal end of the post connects. The solder can be used in a thermal reflow process to mount the semiconductor die to a package substrate in a flip chip mounting arrangement. The solder joints that are formed provide electrical and mechanical connection between the semiconductor die and the package substrate.

Alternative package substrates include pre-molded lead frames (PMLF) and molded interconnect substrates (MIS) for receiving semiconductor dies. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrate can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as FR4 can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximate end of the post connect is mounted to a bond pad on the active surface of a semiconductor die, while a distal end of the post connect is extended away from the bond pad of the semiconductor die. When the packaged semiconductor device is oriented with the semiconductor die positioned above and facing a die mount surface of a package substrate in a flip-chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and a solder bump or ball at the distal end facing away from the surface of the bond pad on the semiconductor die, where a proximal end of the post connect is mounted to the bond pad. The conductive material remains intact after the solder bump is melted during a solder reflow process, the conductive material controlling the vertical spacing or controlling the "collapse" of the post connect structure during solder reflow.

A package substrate, such as a lead frame, MIS, or PMLF substrate, will have conductive portions on a die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that it appears as a rail or rectangle. Solder will be formed at the distal end of the post connect. When the post connect is copper and is pillar shaped and solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. The solder at the ends of the post connects is used in a thermal reflow process to make a solder joint. The solder joint provides both a mechanical attachment and an electrical connection between the semiconductor die and the package substrate. Post connects are used to form several, tens, hundreds or thousands of connections between a semiconductor die and a substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Pot connects can vary in size and shape, but in examples range from 10-70 microns in diameter, and may range from 20-50 microns in height from the bond pad surface on the semiconductor die. The solder ball or bump may have a height from 5-15 microns, so that the total height of the post connect and bump may range from 25-65 microns. As device sizes continue to fall and the density of connections rises, these sizes may decrease.

In packaging semiconductor devices, a mold compound may be used to partially cover a package substrate, to cover the semiconductor die, and to cover the connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device. Flip chip mounted devices can be used. In flip chip mounting, solder balls, solder columns, or solder bumps are formed on the conductive post connects. The post connects are formed extending from bond pads of the semiconductor die. The semiconductor die is then oriented with the solder bumps at the distal ends of the post connects facing a die mounting surface of a circuit board or substrate. A solder reflow process is used to attach the solder bumps to the conductive die pads or leads on the package substrate, the solder forming a physical attachment and an electrical connection between the package substrate and the semiconductor die. Mold compound or other protective dielectric material can cover the die and a portion of the package substrate to complete the flip chip package.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements.

In the arrangements, a package includes a semiconductor die that is flip-chip mounted to a first package substrate. A second package substrate has a thermal pad portion that is placed with the thermal pad spaced from the backside of the semiconductor die, and the semiconductor die, the first package substrate and the second package substrate are encapsulated in mold compound to form a packaged device. The thermal pad of the second package substrate has a surface that is exposed from the mold compound on a board side or "bottom" surface of the device package. When the device package is mounted to a printed circuit board, the thermal pad can be soldered or placed in thermal contact to a thermal pad on the printed circuit board to make an efficient thermal transfer path to the printed circuit board. The leads of the package are soldered in a thermal reflow to make electrical connections and mechanical connections to the printed circuit board. Some additional thermal transfer from the semiconductor die to the printed circuit board is provided by the leads of the package, which are portions of the first package substrate.

Figure 1B:
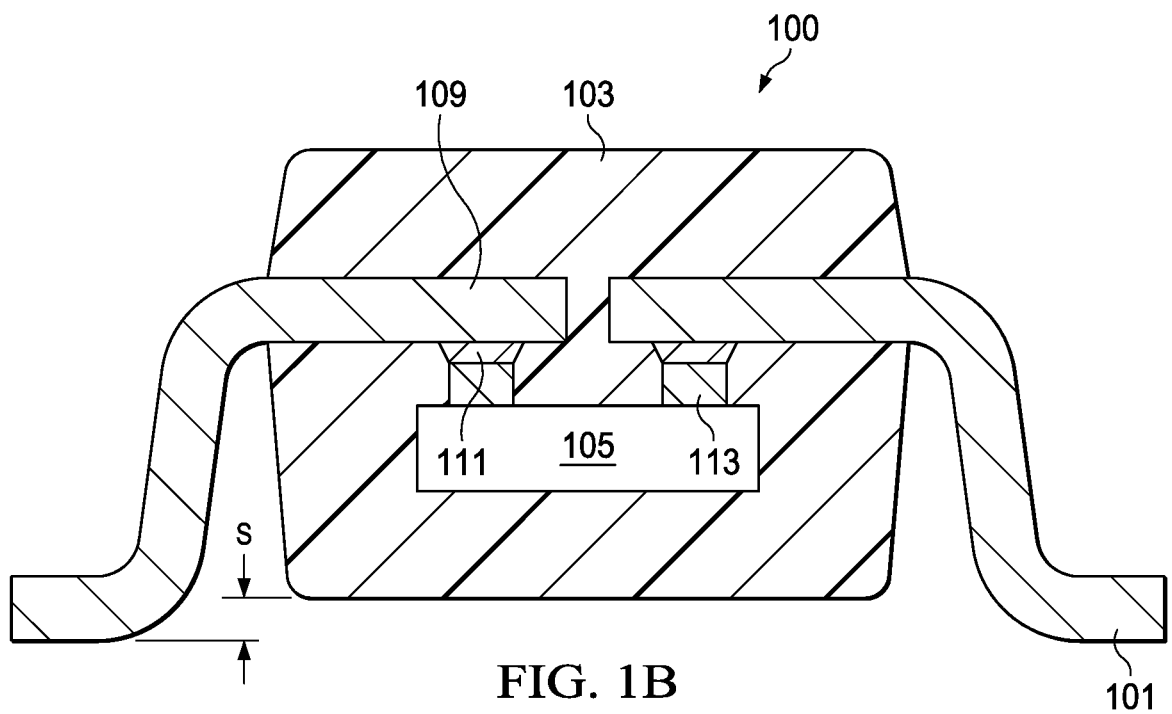
Figure 1C:
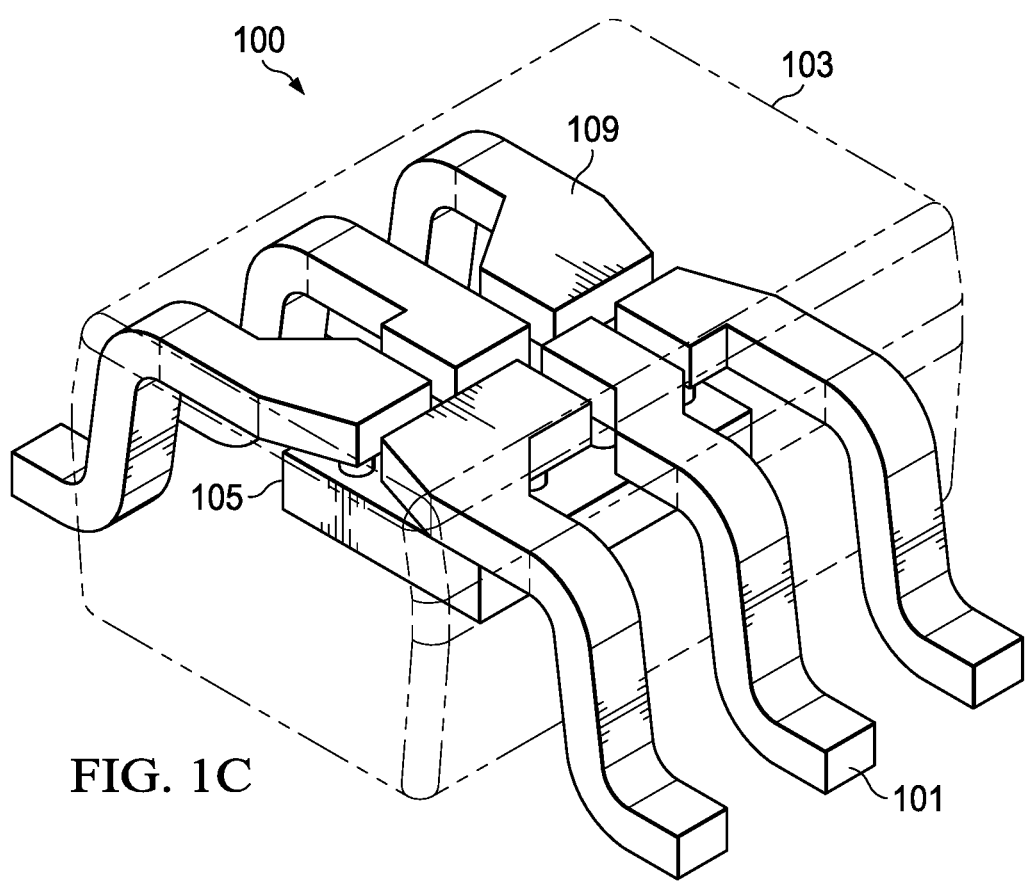

FIGS. 1A-1C illustrates in a projection view, a cross section, and an exploded projection view, respectively, a packaged electronic device 100 in a small outline transistor (SOT) package. SOT packages are used for low terminal count devices such as passive components, transistors, and analog circuits. The packaged electronic device 100 has a body formed from a mold compound 103, such as an epoxy resin. Other mold compounds, such as resins, epoxies, or plastics can be used. Leads 101 are part of a package substrate 109 (not visible in FIG. 1A, see FIG. 1B) that supports a semiconductor die 105 (not visible in FIG. 1A, as it is obscured by the package body, see FIG. 1B) within the package 100, the leads 101 are exposed from the mold compound 103 and form electrical terminals for the packaged electronic device. The packaged electronic device 100 can be mounted to a circuit board or module using surface mount technology (SMT). Package sizes for packaged electronic devices are continually decreasing, and currently can be several millimeters on a side to less than one millimeter on a side, although larger and smaller sizes are also used. Future package sizes may be smaller. A JEDEC standard for a 6 terminal SOT package, as an example useful with the arrangements, is the SOT-23-6 package. An example of this package has a body that is about 3 millimeters long, and about 1.75 millimeters wide, and that the total package width including the leads to the ends of the leads is about 3 millimeters wide. The package body has a height of about 1.45 millimeters including the ends of the leads 101.

As seen in FIG. 1B, semiconductor die 105 is flip chip mounted to a die mount portion of a package substrate 109. In this example the package substrate 109 is a metal lead frame. Exposed portions of the lead frame form leads 101. The die 105 is coupled to the lead frame by post connects 113. The post connects 113 can be, in an example, copper pillar bumps. Solder joints 111 are formed between the post connects 113 and the package substrate 109 (a lead frame) by a thermal reflow process. The solder joints 111 provide both mechanical connection and electrical connections between the semiconductor die 105 and the package substrate 109. The bottom of package 100 (as the package is oriented in FIG. 1B) is spaced from the bottom of the leads 101 by a spacing distance "S." This spacing distance "S" will be filled with ambient atmosphere when the packaged device 100 is surface mounted to a system board, and the thermal transfer path from the semiconductor die 105 to the board is then through the leads 101 of the lead frame.

FIG. 1C illustrates, in an exploded projection view, the packaged device 100 with the leads 101, the package body formed by mold compound 103, the package substrate 109, and the semiconductor die 105 which is flip chip mounted to the package substrate 109. The active surface of the semiconductor die 105 faces the package substrate 109, so that as oriented in FIG. 1C, the semiconductor die faces up, and has a backside surface facing downwards, towards the board side of the package 100. When the package 100 is surface mounted to a board using the ends of the leads 101 to solder to the board, the backside of semiconductor die 105 will face the board.

Figure 2A:
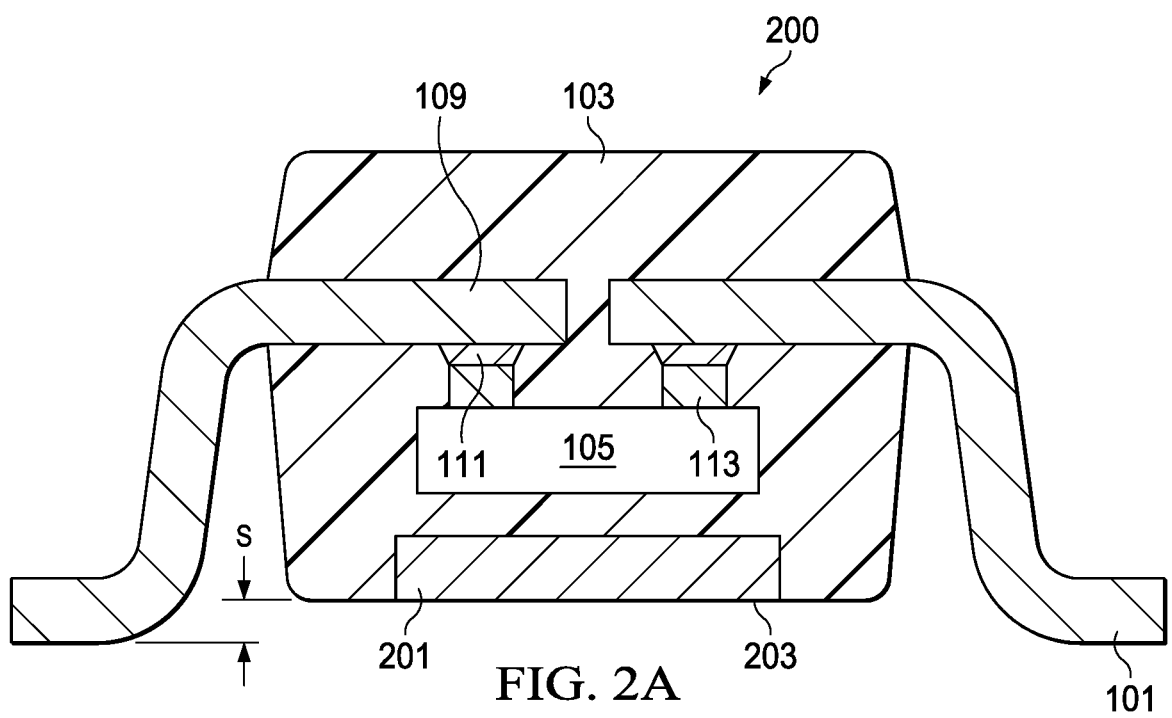
FIGS. 2A-2C illustrate, in a cross sectional view, a partially exploded view, and a projection view looking from a bottom side, respectively, an arrangement in an SOT package.
Figure 2B:
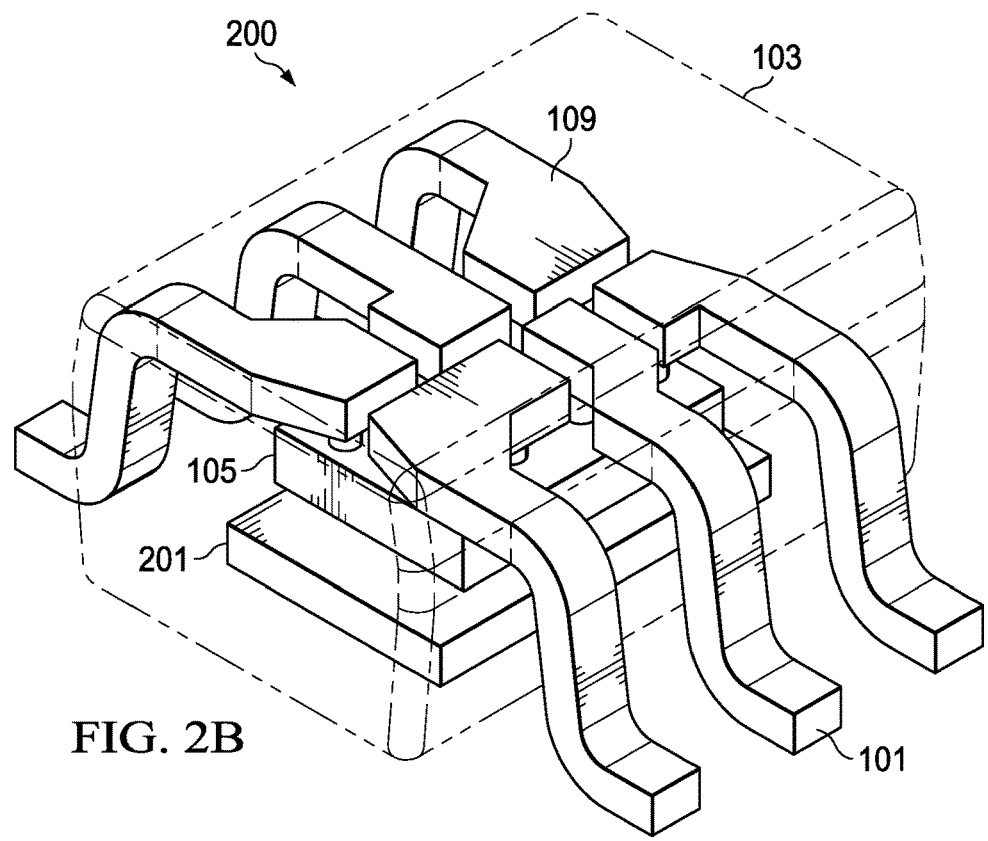
Figure 2C:
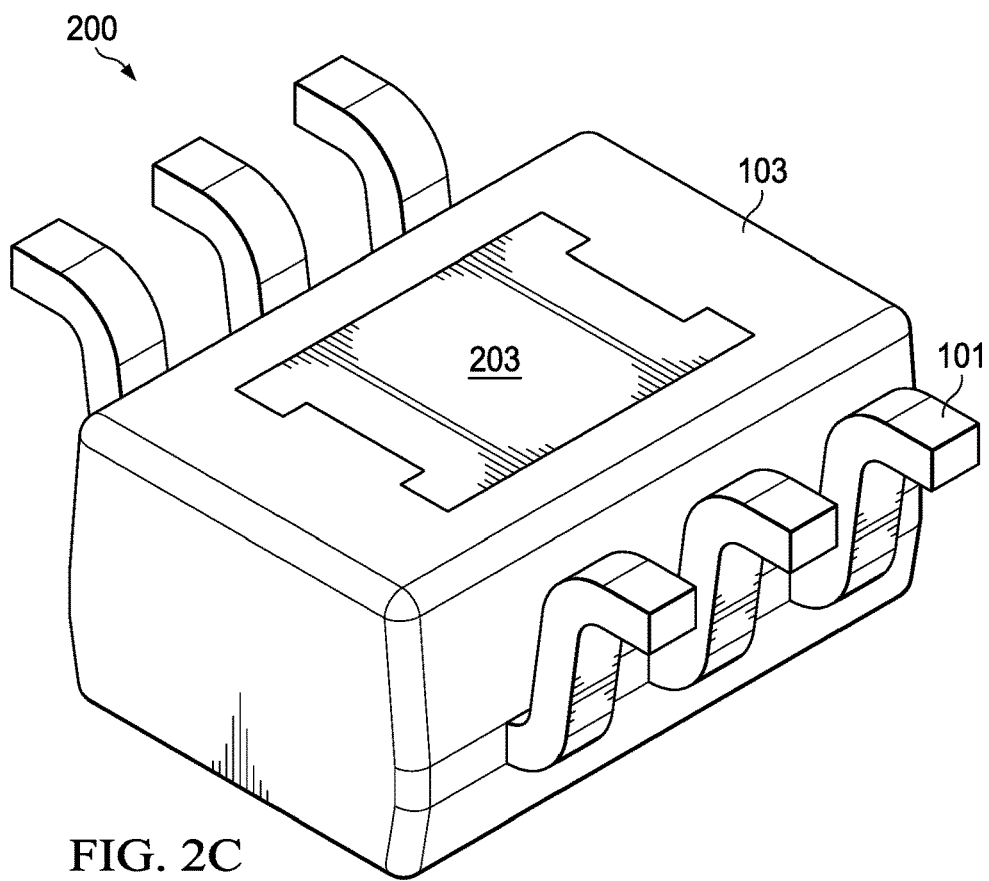

FIGS. 2A-2C illustrate, in a cross sectional view, an exploded projection view and a bottom side projection view, respectively, an arrangement for an SOT package 200. Semiconductor die 105 is mounted to a first package substrate (a lead frame in this example) 109 by post connects 113 by solder joints 111. Mold compound 103 forms a package body for the packaged device 200. Leads 101 extend from the first package substrate 109. A second package substrate (in this example, another lead frame) 201 is shown. Second package substrate 201, in this example, is a downset lead frame with a thermal pad that is positioned at the bottom surface of the package body. The second package substrate 201 is a thermally conductive material, for example, it can be a copper leadframe. The second package substrate 201 has a bottom surface 203 that is exposed from the mold compound 103 and provides a solderable surface for connection to a thermal pad on a printed circuit board. The thermal pad of the second package substrate greatly improves the thermal transfer from the semiconductor die 105 to the printed circuit board. The bottom surface 203 of the second package substrate 201 is spaced from the mounting plane by the space "S", but as is shown below, solder is used to couple the second package substrate 201 to a printed circuit board, solder fills the space "S" when the packaged device 200 is surface mounted. In FIG. 2C the packaged device 200 is shown in a bottom up projection view, with leads 101 facing upwards, and the surface 203 of the thermal pad shown exposed from the mold compound 103.

Figure 3:
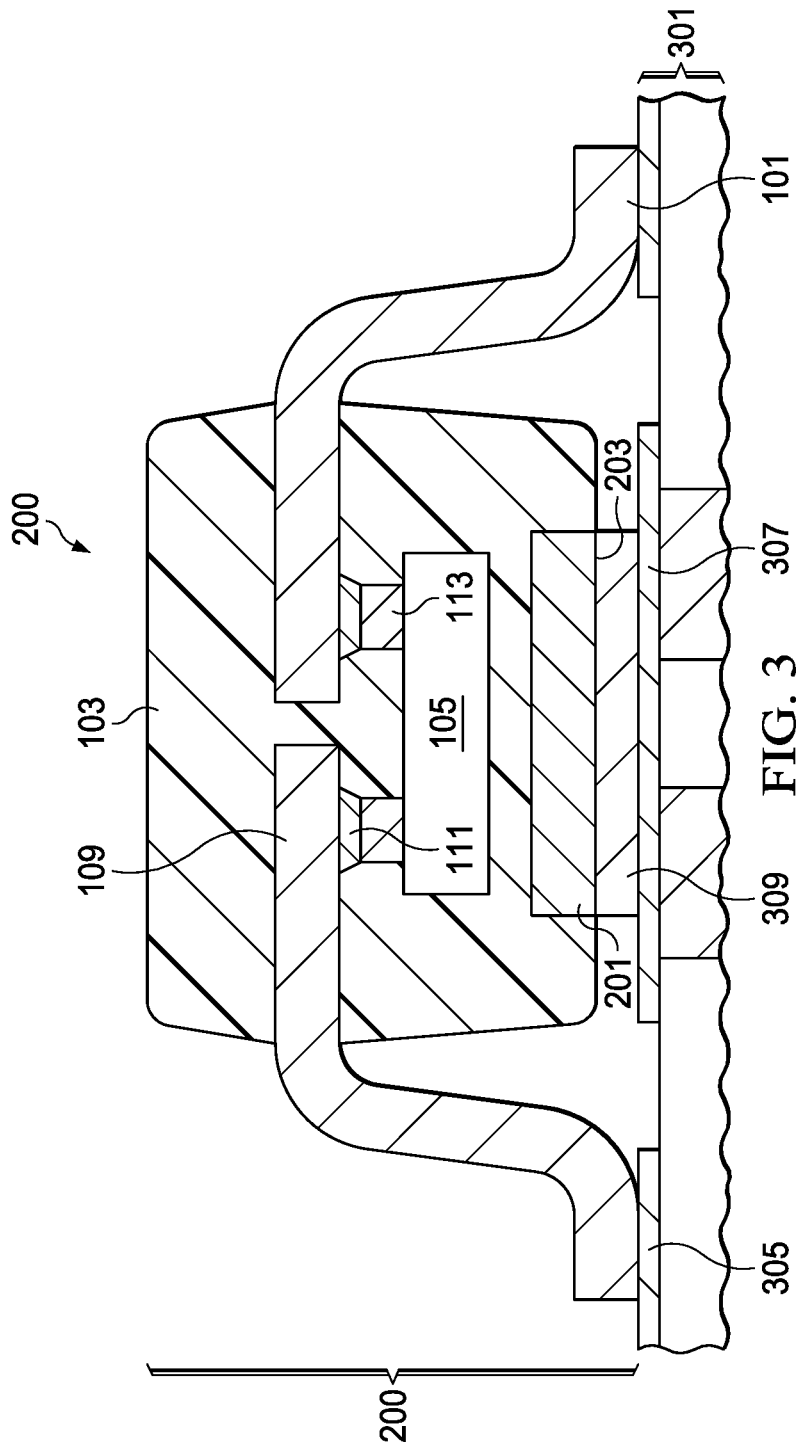
FIG. 3 illustrates, in a cross sectional view, an arrangement in an SOT package surface mounted to a printed circuit board.

FIG. 3 is a cross sectional view of the package 200 of FIGS. 2A-2C now surface mounted to a printed circuit board 301. The printed circuit board 301 has conductive pads 305 that are exposed from dielectric materials such as a solder mask layer. The conductive pads 305 are used to surface mount the package 200 by solder to form solder joints. Leads 101 are soldered to the conductive pads 305 and the bottom surface 203 of the second package substrate 201 is also mounted to a conductive thermal pad 307 on the printed circuit board 301 by a solder joint 309. By providing a thermal path from the backside of the semiconductor die 105 through the mold compound 103 to the printed circuit board. 301, the thermal performance of the packaged device 200 is greatly improved. Some thermal dissipation will also occur through leads 101 into the conductive pads of the circuit board 301. In the arrangements, the backside of semiconductor die 105 may be spaced from the second lead frame 201 by mold compound 103 as shown in FIG. 2A. The mold compound 103 can include metallic fillers to increase thermal performance. In an alternative arrangement, the semiconductor die 105 may have its backside surface in contact with the second leadframe 201.

Figure 4A:
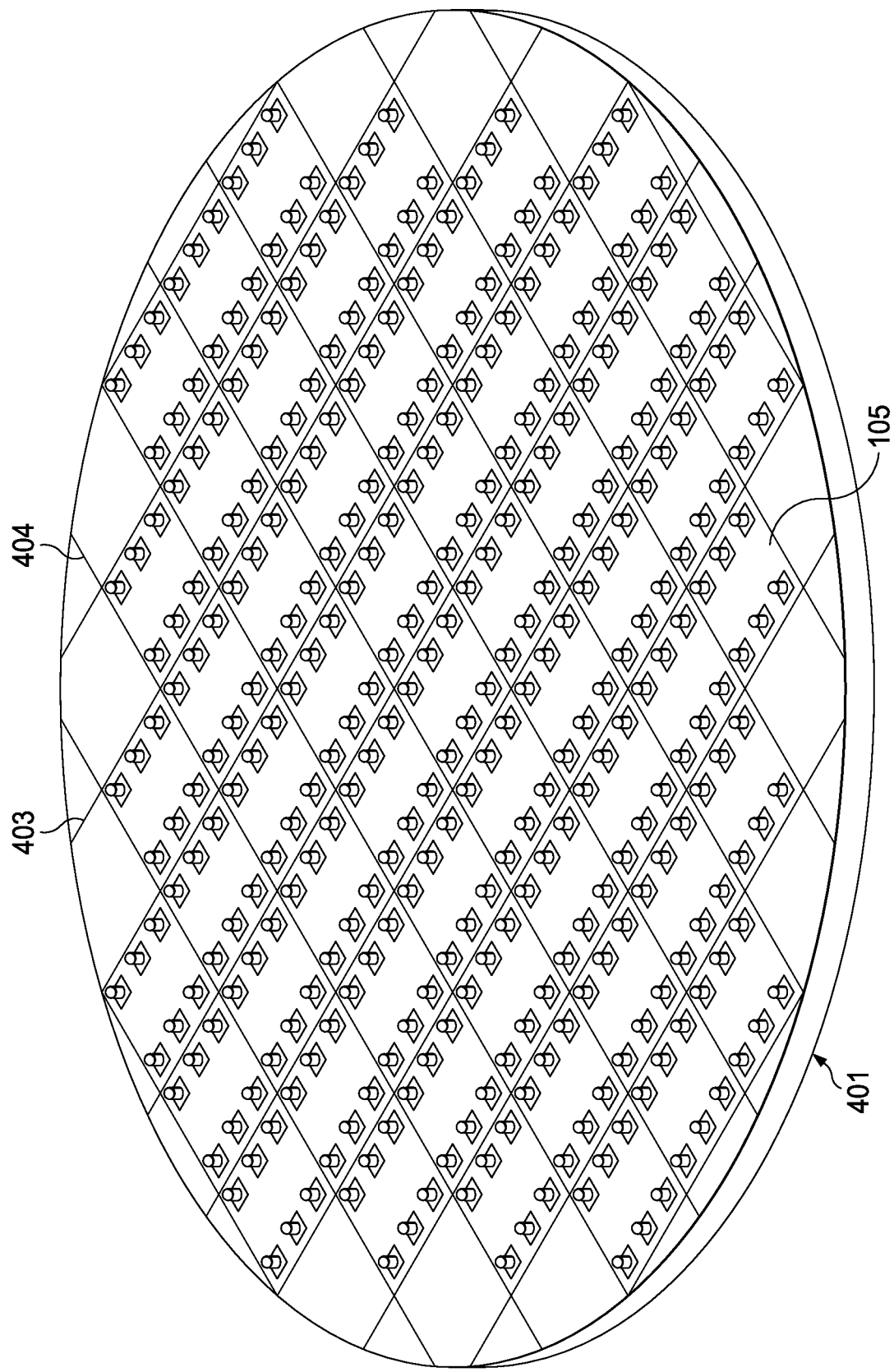
FIGS. 4A-4B illustrate in a projection view and a close up view, respectively, semiconductor dies on a semiconductor wafer with post connects and solder bumps.
Figure 4B:
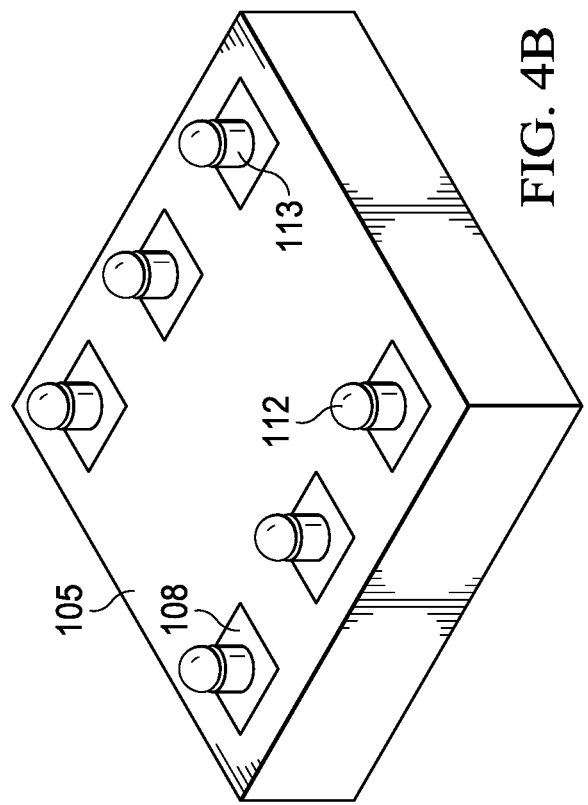

FIGS. 4A-4B illustrate steps used in forming a semiconductor die with post connects. In FIG. 4A, a semiconductor wafer 401 is shown with an array of semiconductor dies 105 in rows and columns formed on an active surface. The semiconductor dies 105 are formed using manufacturing processes in a semiconductor manufacturing facility, including ion implant doping, anneals, oxidation, dielectric and metal deposition, photolithography, pattern, etch, chemical mechanical polishing (CMP), electroplating, and other processes for making semiconductor devices. Vertical and horizontal (as the wafer is oriented in FIG. 4A) scribe lanes 403 and 404, which are perpendicular to one another and which run in parallel groups across the wafer 401, separate the rows and columns of the completed semiconductor dies, and provide areas for dicing the wafer to separate the semiconductor dies 105 from one another.

FIG. 4B illustrates a single semiconductor die 105, with bond pads 108, which are conductive pads that are electrically coupled to devices (not shown for simplicity) formed in the semiconductor die 105. Conductive post connects 113 are shown extending away from a proximate end mounted on the bond pads 108 on the active surface of semiconductor die 105, and solder bumps 112 are formed on the distal ends of the conductive post connects 113. The conductive post connects 113 can be formed by electroless or electroplating. In an example, the conductive post connects are copper pillar bumps. Copper pillar bumps can be formed by sputtering a seed layer over the surface of the semiconductor wafer 401, forming a photoresist layer over the seed layer, using photolithography to expose the bond pads 108 in openings in the layer of photoresist, plating the copper conducive post connects 113 on the bond pads, and plating a lead solder or a lead-free solder such as an tin-silver (SnAg) or tin-silver-copper (SnAgCu) solder to form solder bumps 112 on the copper conductive post connects 113. Other conductive materials can be used for the conductive post connects in an electroplating or electroless plating operation, including silver, nickel, palladium, or tin, for example. The photoresist is then stripped, and the excess seed layer is etched from the surface of the wafer. The semiconductor dies are then separated by dicing, or are singulated, using the scribe lines 403, 404 (see FIG. 4A).

Figure 5A:
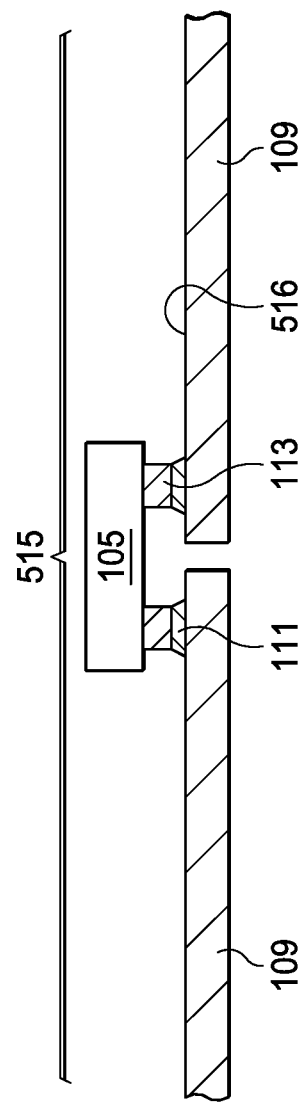

FIGS. 5A-5I show, in a series of cross sectional views, a process for packaging semiconductor dies 105 to form arrangements. FIGS. 5A-5B show, in a cross sectional view and a side view, the process of mounting the semiconductor dies 105. The semiconductor dies 105 are flip-chip oriented, with the active surface of the semiconductor dies 105 facing a die mount portion of a die mounting surface 516 of package substrate 109. In the illustrated example, the package substrate 109 is a conductive lead frame. The lead frames may be provided in a grid or matrix of units with an array of rows and columns, each unit lead frame 515 in a strip or array is spaced from an adjacent unit lead frame by saw streets 511. The use of the grid or matrix enables many packaged units to be assembled in a single production run, increasing productivity. However, in an alternative approach, a single unit can be individually assembled. The unit lead frames 515 have a conductive surface 516 and may include plated areas (not shown) to receive the solder bumps. Example plating layers include tin, silver, gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used over the mounting surface 516 or alternatively these materials may be selectively formed at the solder joint positions by spot plating.

FIG. 5A illustrates in a cross sectional view a semiconductor die 105 flip chip mounted to the mounting surface 516 of a package substrate 109, a unit lead frame 515 is illustrated in the cross section. Solder joints 111 are formed by a thermal reflow process to melt the solder bumps (see FIG. 4B, 112) at the distal ends of the conductive post connects 113. In FIG. 5B, in a side view of the package substrate 109, two dies 105 are shown flip chip mounted to respective individual unit lead frames 515 and spaced by a saw street 511 between the unit lead frames 515. The solder joints 111 provide both mechanical attachment and electrical connection between the semiconductor devices die 105 and the package substrate 109.

FIG. 5C is another cross sectional view of the package substrate 109 from FIG. 5A, after additional processing steps. In FIG. 5C, the unit leadframe 515 becomes a first package substrate, a lead frame associated with the semiconductor die 105, and a second package substrate 501 including a thermal pad 201 is positioned with a die side surface 202 and a board side surface 204 opposite the die side surface 202. Package substrate 501 includes "downset" lead frames, but in the orientation of FIG. 5C, the board side surface of the semiconductor dies 105 is oriented upwards, the package substrate 109 has a surface 516 that is a board side surface for mounting the semiconductor dies. The thermal pad 201 is shown positioned above the backside surface of die 105 (as the devices are oriented in FIGS. 5A-5J), for processing.

FIG. 5D shows the first package substrate 109 and second package substrate 501 in a side view with the unit lead frames 515 spaced by a saw street 511, each semiconductor die 105 has a thermal pad 201 from the second package substrate 501 associated with it and positioned above the backside or board side surface of the semiconductor die 105, as shown in FIG. 5D. The thermal pads 201 of the second package substrate 501 are formed in correspondence with the first package substrate 109, so for each unit lead frame 515 there is a corresponding thermal pad 201 that will be positioned over the corresponding semiconductor die 105. The two package substrates 109, 501 are stacked for processing as shown in FIG. 5D. In some arrangements, the package substrate 109 may be a single column or row of unit devices, while in other arrangements, the unit devices can be arranged in an array of rows and columns, or a two dimensional matrix. The second package substrate 501 will be designed in correspondence with the first package substrate 109.

Figure 5E:
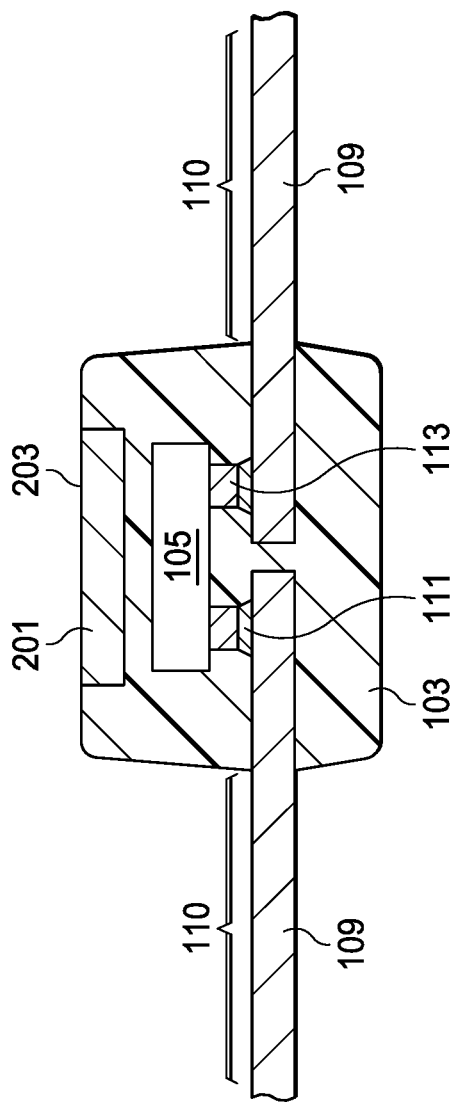
Figure 5F:
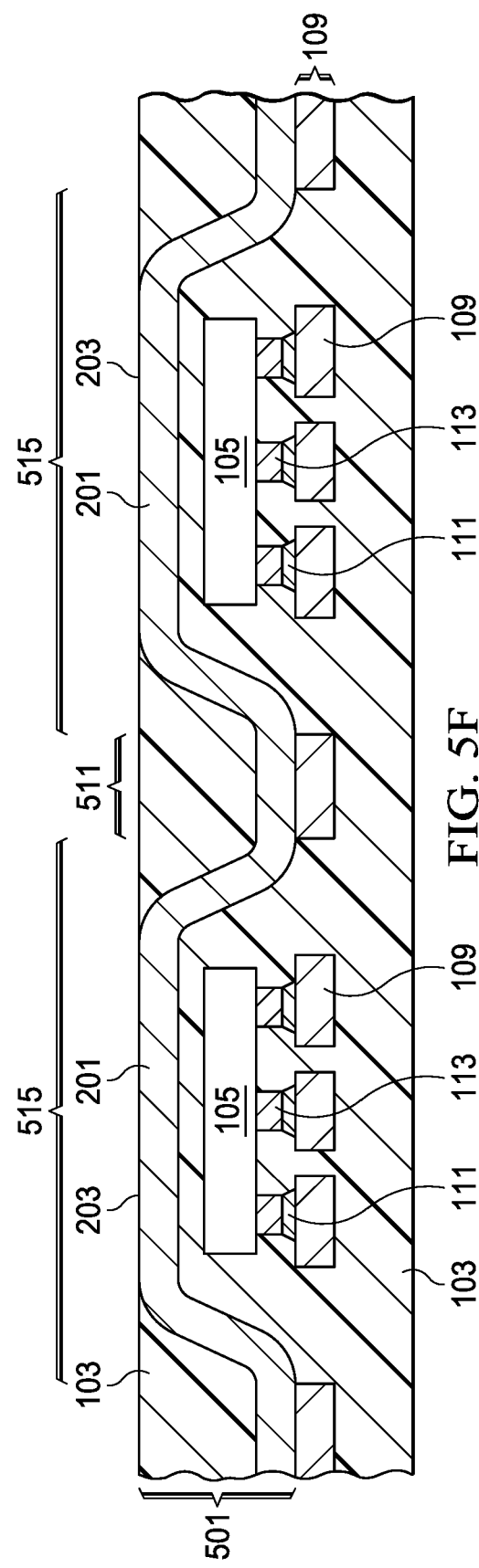

FIG. 5E shows in a cross section, and FIG. 5F shows in a side view, the package substrate 109 of FIGS. 5C and 5D after additional processing. An encapsulation process is used to form packages using mold compound 103 in a molding operation to cover the devices. In FIG. 5E, in a cross sectional view, the thermal pad 201 has a board side surface 203 that is exposed from the mold compound 103. The first package substrate 109 has portions 110 that are exposed from the mold compound 103, these will be shaped to form leads for the completed packages.

In FIG. 5F, the first package substrate 109 is covered by the second package substrate 501 which includes the thermal pads 201 over the semiconductor devices 105. The mold compound 103 covers the semiconductor dies 105 and portions of the package substrate 501, while surface 203 of the thermal pad 201 for each unit is exposed from the mold compound. The unit lead frames 515 are spaced form one another by a saw street 511 which will be used in a singulation process to separate the completed devices.

Figure 5G:
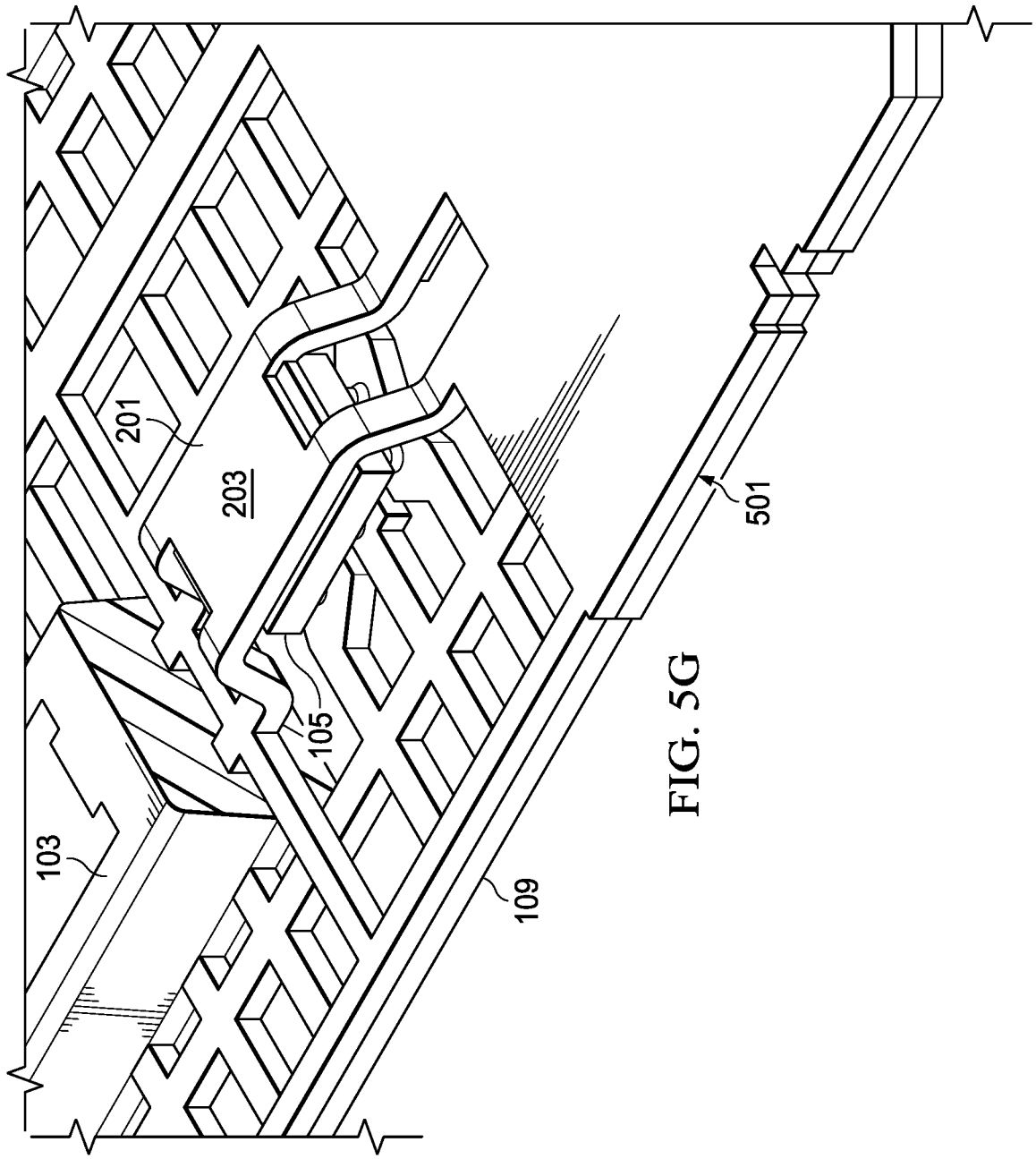

FIG. 5G illustrates in a projection view a portion of an array of molded devices after being block molded with mold compound 103. In FIG. 5G one portion is shown without the mold compound of the block molding, to better illustrate the elements. The package substrate 109 is shown with an array of rows and columns of unit lead frames. The second package substrate 501 is placed over the package substrate 109 and the downset portions of second package substrate 501 form the thermal pads with the exposed surfaces 203 over each of the units. Semiconductor die 105 is shown with thermal pad 203 positioned over the backside surface.

Figure 5H:
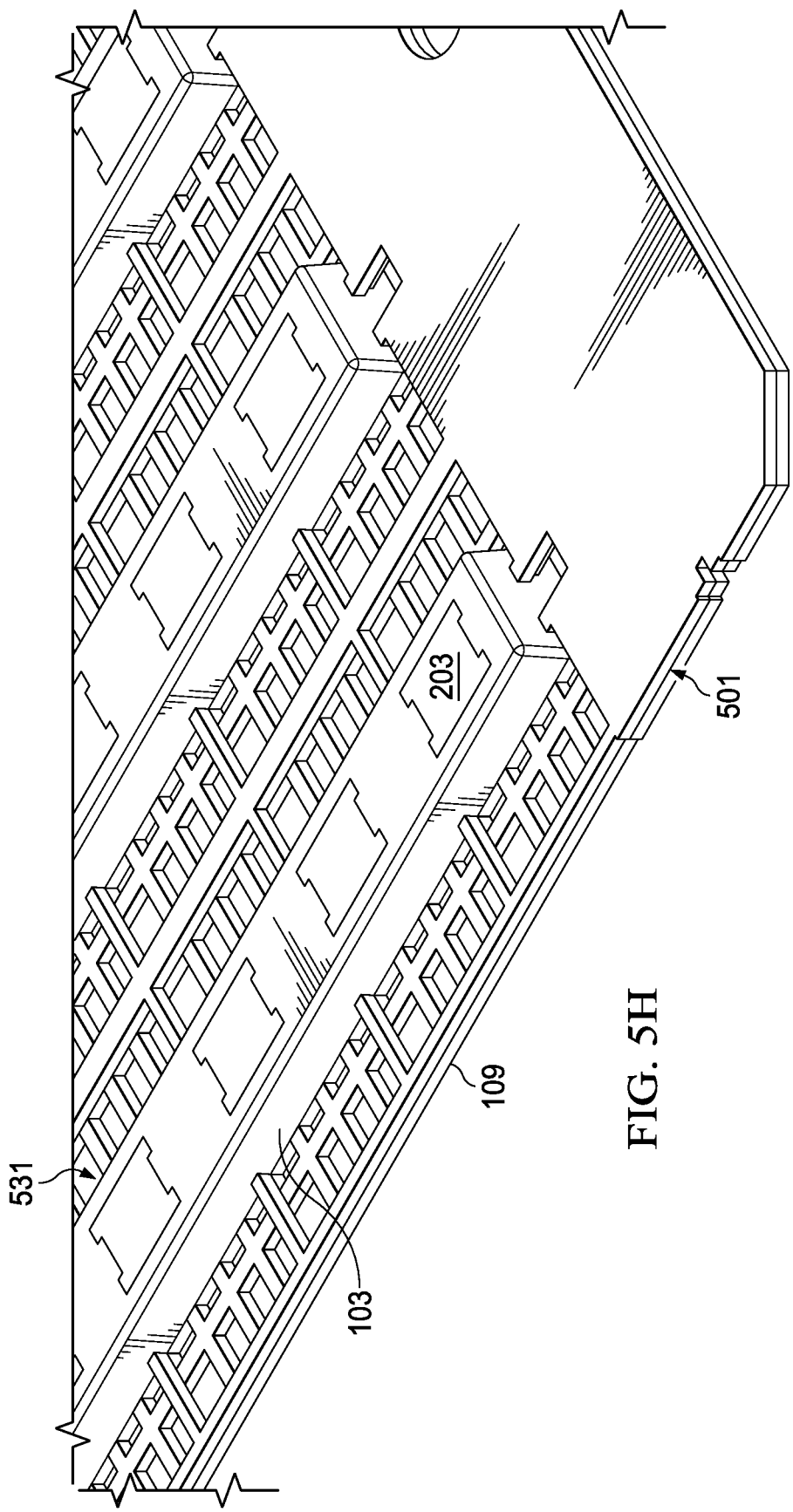

FIG. 5H illustrates in a projection view a portion of an array of molded devices 531 after being block molded with mold compound 103. The package substrate 109 is shown with an array of rows and columns of unit lead frames. The second package substrate 501 is placed over the package substrate 109 and the downset portions form the thermal pads with the exposed surfaces 203 over each of the units.

Figure 5I:
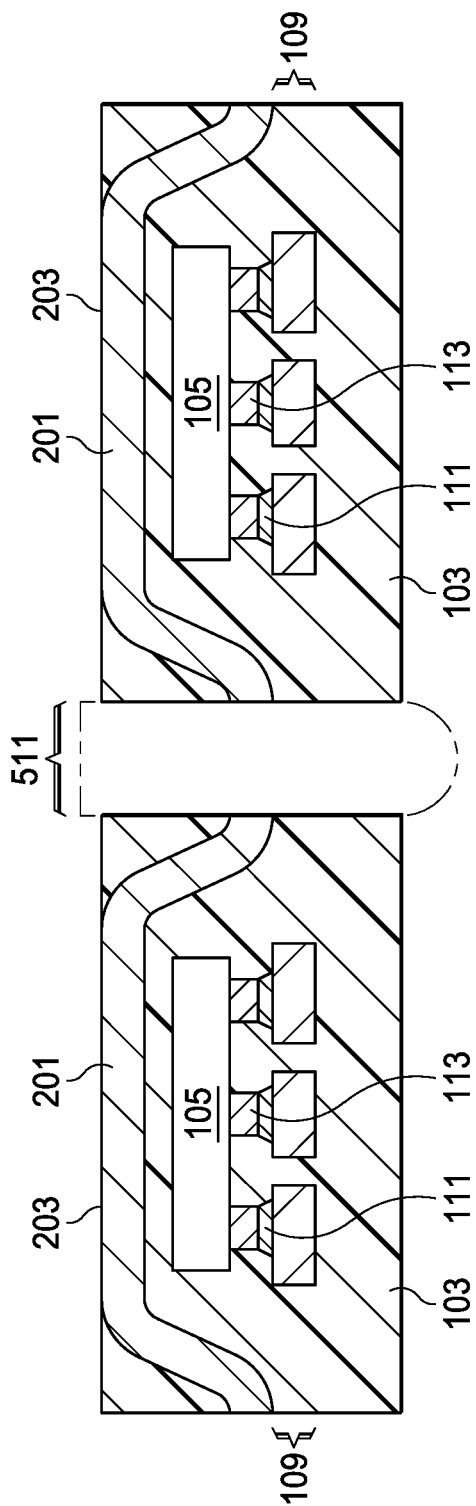
Figure 5J:
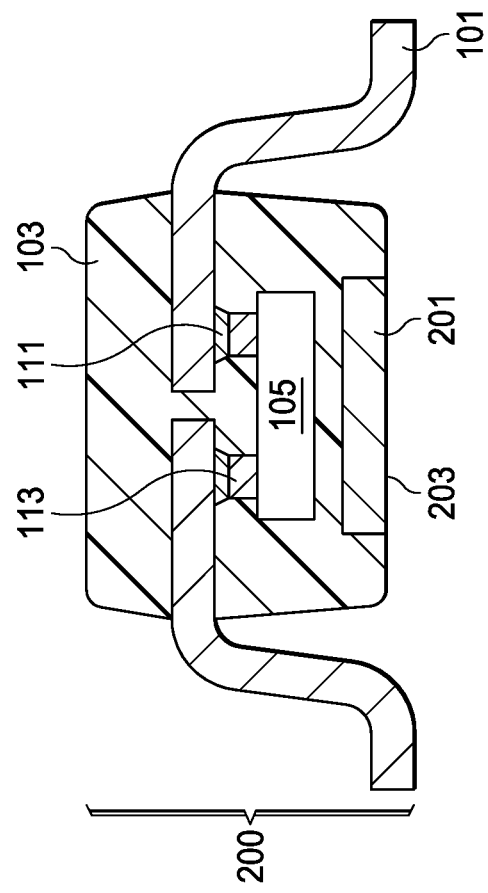

FIGS. 5I-5J illustrate the molded devices of FIGS. 5G-5H after a singulation (see FIG. 5I) and after a trim and form process (FIG. 5J). In FIG. 5I, a side view illustrates the singulation process, where devices are separated by cutting through the saw streets 511, the cuts going through the first package substrate, the second package substrate, and the mold compound 103 between devices to separate them one form another. In FIG. 5J, the package device 200 is shown after lead shaping by a mechanical forming tool to form leads 101 extending alongside the package towards the board side surface, and having bottom portions configured for surface mounting. The exposed surface 203 of the thermal pad 201 is also configured for surface mounting to a printed circuit board, so that (see FIG. 3) the leads 101 and the surface 203 of the thermal pad 201 can be soldered to a printed circuit board. By soldering surface 203 to a thermal sink on the printed circuit board, the thermal dissipation of package 200 is greatly increased when compared to packages formed without the arrangements.

Figure 6:
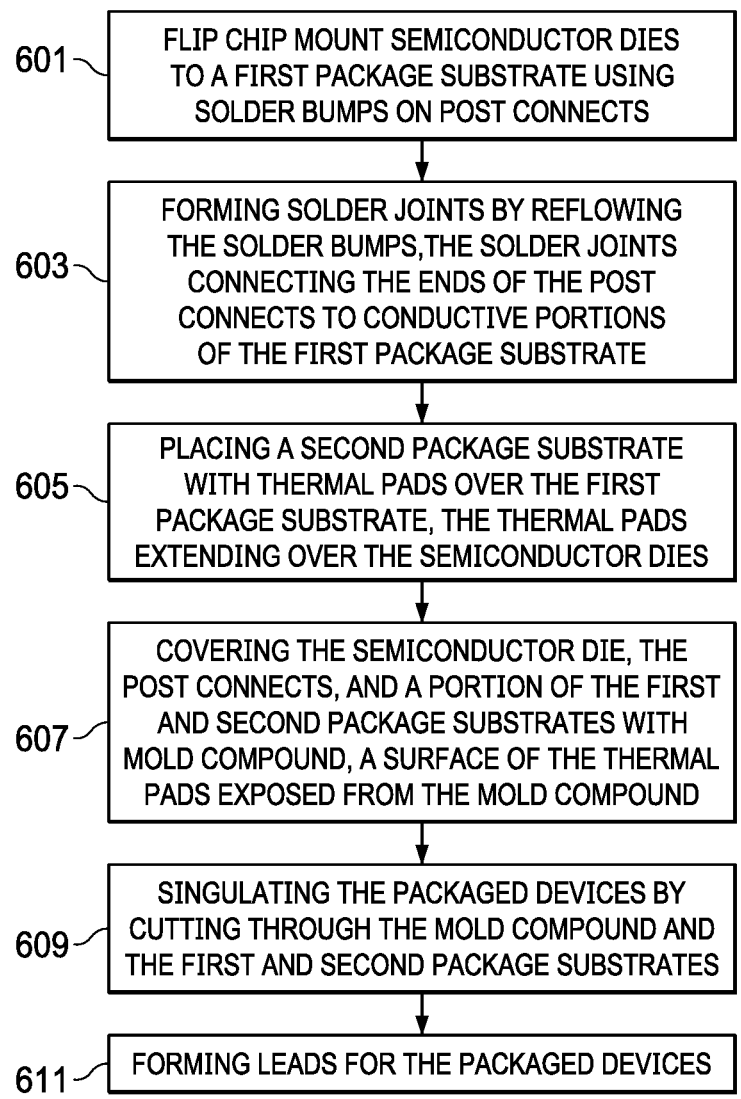
FIG. 6 illustrates in a flow diagram selected steps of a method for forming the arrangements.

FIG. 6 illustrates in a flow diagram selected steps of a method for forming the arrangements.

At step 601, the semiconductor dies are flip chip mounted on a first package substrate (see FIG. 5A). The solder bumps at the distal ends of the post connects are placed on the package substrate. At step 603, solder joints are formed by a thermal reflow process that melts the solder bumps and mechanically and electrically connects the distal ends of the post connects to the package substrate (see FIGS. 5A-5B). At step 605, the second package substrate is placed on the first package substrate with thermal pads placed over the board side of the semiconductor devices (see FIGS. 5C-5D). In step 607, the encapsulation process covers the semiconductor dies, the thermal pad, the post connects and portions of the first package substrate with mold compound (see FIGS. 5E-5F and a projection view of the molded devices in FIGS. 5G-5H). At step 609, the packaged devices are singulated by a sawing operation where the first and second package substrates and the mold compound are cut through in the saw streets between devices (see FIG. 5I). At step 611, the lead portions of the first lead frames that extend from the mold compound are trimmed and shaped to form the package leads, and complete the packaged devices. (See FIG. 5J).

The use of the arrangements provides a packaged device with enhanced thermal dissipation, without the need to change the design of the semiconductor die, the first package substrate, or the mold tools, and using existing methods and tooling for making the devices. In the example arrangements illustrated, the semiconductor die is not in contact with the thermal pad of the second package substrate, but in alternative arrangements where the semiconductor dies have greater thickness, the dies may contact the thermal pad. The example packages illustrated in the drawings are leaded packages. For example, SOT packages are shown.

Many other package types that use flip chip mounted semiconductor dies can be used in additional arrangements. In another alterative arrangement, a "no-lead" package such as a quad flat no-lead package can be used. In the no-lead packages, the terminals of the package formed by portions of the first lead frame are exposed from the mold compound but do not extend from the package body, so that the terminals are within the exterior boundary of the package body. Both leaded and no-lead types of packaged devices can be surface mounted to a printed circuit board.

FIGS. 7A-7G illustrate, in a series of cross sectional views, steps for forming an alternative arrangement for a no-lead package with a thermal pad. In FIGS. 7A-7G, steps for forming a "top side cooling" arrangement are shown. The thermal path for the semiconductor die in a package in these arrangements is through the "top side" of the packaged device, away from the board side. In the arrangements a semiconductor die is flip chip mounted to a top side surface of a first package substrate, for example, a metal lead frame. The post connects extending from the active surface of the semiconductor die are coupled to the package substrate by solder at the distal ends of the post connects, which are subjected to a thermal reflow process. A thermal pad of a second package substrate is attached to the backside surface of the semiconductor die, which faces away from the first package substrate and the board. The thermal pads of the second package substrate can be part of another thermally conductive metal lead frame. The thermal pads are mounted to the semiconductor dies in a lead frame strip, and then singulated one from another, for example by a laser cutting tool. The assembled devices are molded, then the package substrate, the mold compound are cut through in saw streets between the semiconductor dies to singulate the unit packaged devices. The thermal pads can be patterned to have fins or other features that increase the surface area of the heat sink, for additional thermal performance. Air can conduct heat from the packaged devices by convection. Additional cooling can be achieved using forced air, or by flowing a gas or liquid coolant, over the packaged devices in operation, to further cool the semiconductor die by increasing the thermal transfer out of the packaged devices.

Figure 7A:
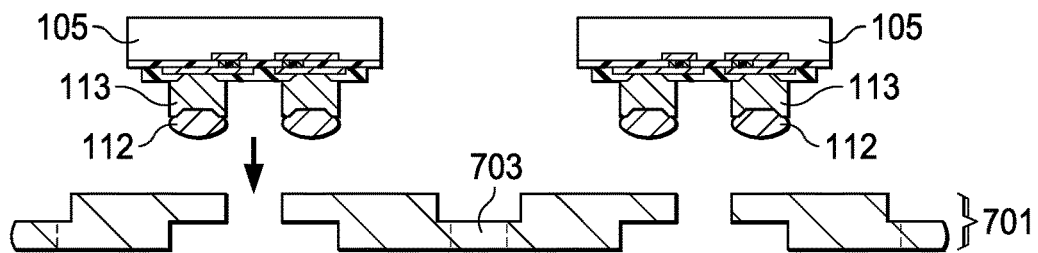
FIGS. 7A-7H illustrate, in a series of cross sectional views, major steps for forming an arrangement.

In FIG. 7A, semiconductor dies 105 are shown positioned with the post connects 113 and solder bumps or balls 112 facing the top side surface of a first package substrate 701, in this example a conductive lead frame. The conductive lead frame shown in FIG. 7A is a partially etched copper lead frame, that is portions of a copper substrate are removed by a top side etch, by a bottom side etch, or by both. In this manner, full thickness portions and half thickness portions can be formed, the half thickness portions can be in the upper half, or lower half, of the lead frame. Openings through the lead frame can be formed by etching both the top side and bottom side in a location for a through hole or opening. In FIG. 7A a saw street 703 is shown between two unit lead frame devices.

Figure 7B:
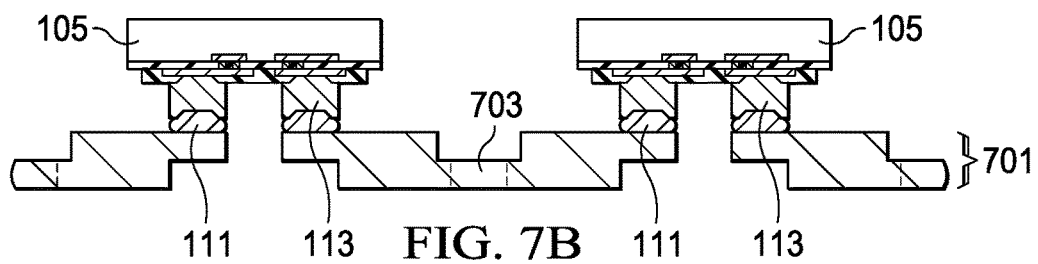

In FIG. 7B, the two semiconductor dies 105 are shown after being positioned, using pick and place tools, on the top side surface of the package substrate 701. The semiconductor dies are flip chip mounted on the leads of the lead frame, and so the arrangement is another flip chip on lead or FCOL arrangement. In contrast to the arrangements of FIGS. 5A-5I, the semiconductor dies 105 in FIGS. 7A-7G are mounted on the top side of the package substrate 701, opposite the board side. In FIG. 7B the solder bumps 112 at the distal ends of the post connects 113 are subjected to a thermal reflow to form solder joints 111 between the post connects 113 and the package substrate 701.

Figure 7C:
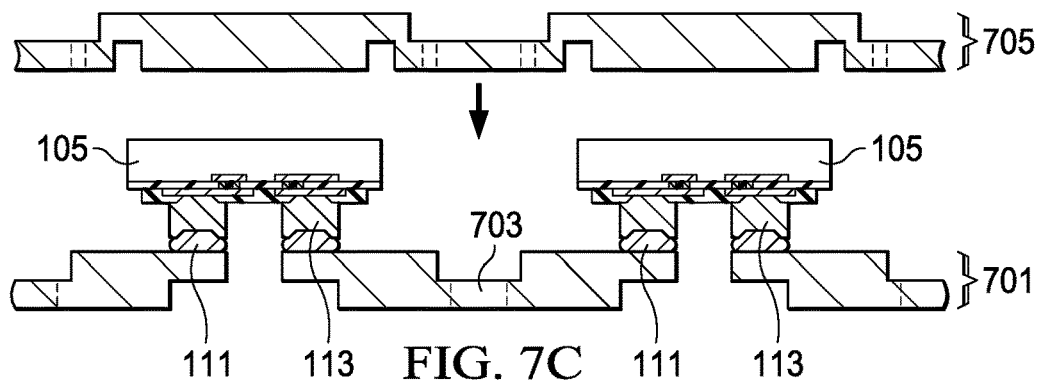

In FIG. 7C, the first package substrate 701 is shown with a second package substrate 705 positioned over the backside surfaces of the semiconductor dies 105, which are shown positioned with the backside surfaces facing up (as oriented in FIGS. 7A-7G.) The second package substrate is another thermally conductive substrate, such as a copper lead frame, and as shown in the example illustrated 705 is formed from partially etched lead frame, although in alternative arrangements the lead frame could be stamped, or etched from one side. The second package substrate can have a variety of shapes and can include grooves, notches or other "mold lock" features to increase adhesion to the mold compound.

Figure 7D:
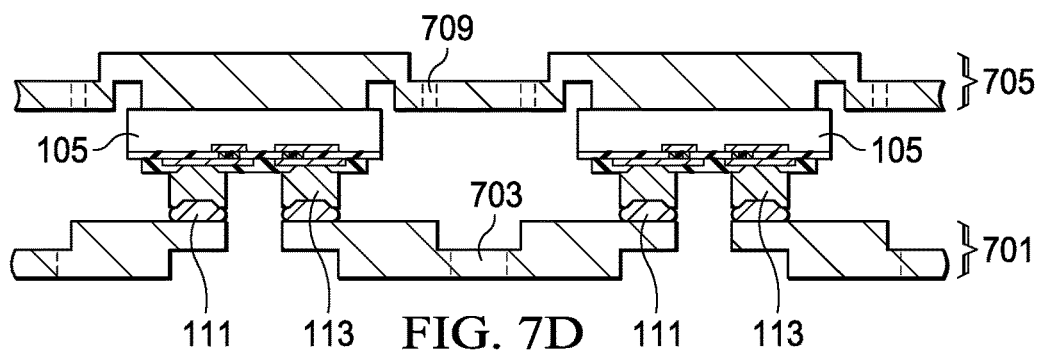

In FIG. 7D the second package substrate 705, which includes thermal pads corresponding to the semiconductor dies, is attached to the backside surface of the semiconductor dies 105. A die attach material such as a film, tape or paste is used, the die attach film is thermally conductive. In an example process the die attach can be stencil printed on the backside of the semiconductor dies, drop on demand or ink jet deposition can be used. The second package substrate 705 is placed so that for the semiconductor dies 105 a corresponding thermal pad is placed on the backside surface.

Figure 7E:
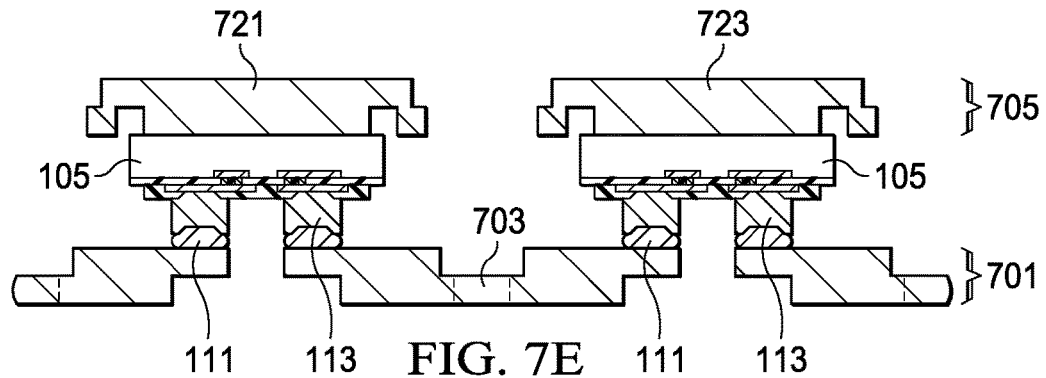

FIG. 7E illustrates the semiconductor dies 105 after additional processing. In the transition from FIG. 7D to FIG. 7E, the second package substrate is cut along laser cut lines 709 to singulate the thermal pads one from another. In FIG. 7E, a first thermal pad 721 is shown, and a second thermal pad 723 is shown adjacent to it. The semiconductor dies 105 are now flip chip mounted to the first package substrate 701 which includes unit devices that are still attached by saw street material 703, while the thermal pads 721, 723 are separated from the second package substrate 705 into individual units.

Figure 7F:
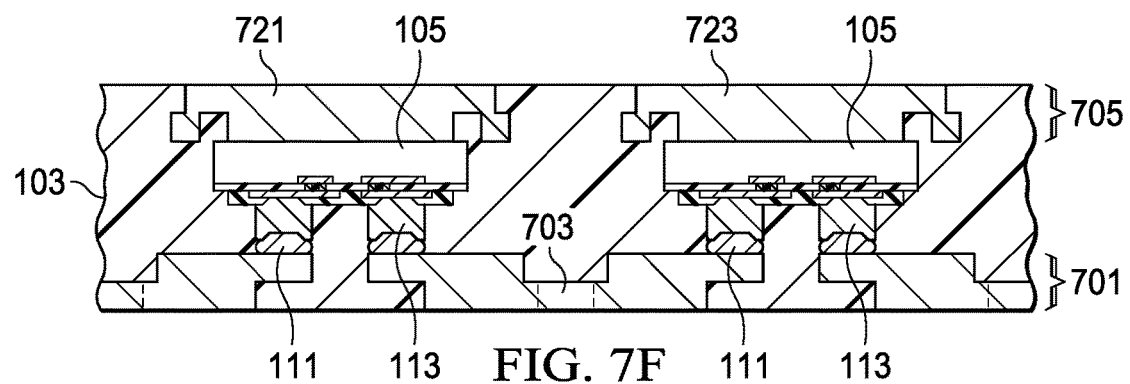

FIG. 7F illustrates the semiconductor dies 105 of FIG. 7E after an encapsulation process step. In FIG. 7F, the semiconductor dies 105, the first package substrate 701, and the thermal pads 721, 723 are covered in mold compound. The saw street 703 still connects the unit devices of the first package substrate 701. The thermal pads 721, 723 can include wings, notches or other "mold lock" features that assist in adhering the mold compound to the thermal pads.

Figures 7G, 7H:
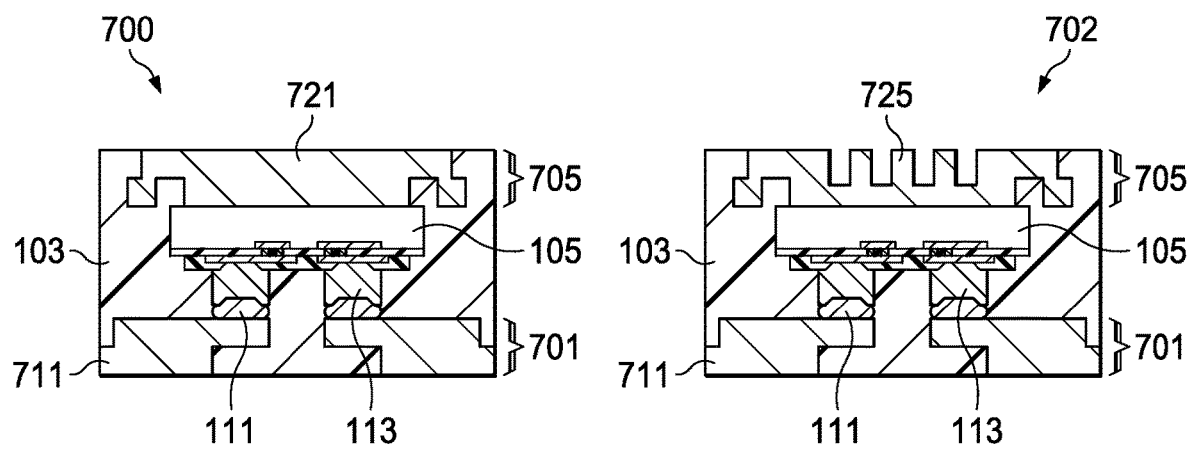

FIGS. 7G and 7H illustrate, in cross sectional views, two examples of packaged devices. After a singulation step following the molding step of FIG. 7F, FIG. 7G shows a solid thermal pad 721 for a packaged device unit 700. In the transition from FIG. 7F to FIG. 7G, a saw is used to cut through the mold compound 103 and the first package substrate 701 along saw streets. The package substrate 701 has portions exposed from the mold compound 103 that form package leads 711 for the packaged device. FIG. 7H is an alternative arrangement, where packaged device 702 had a thermal pad 725 that has fins or grooves. The use of these fins or grooves increases the surface area of the thermal pad 725, and thus increases the thermal transfer from the packaged device 702. In FIGS. 7G-7H, no-lead type packages are shown, such as QFN. Other package types where thermal dissipation are needed, such as small outline (SO), small outline transistor (SOT), and small outline no-lead (SON) packages can be used with the top side cooling and flip chip on leads mounting of the arrangements.

Figure 8:
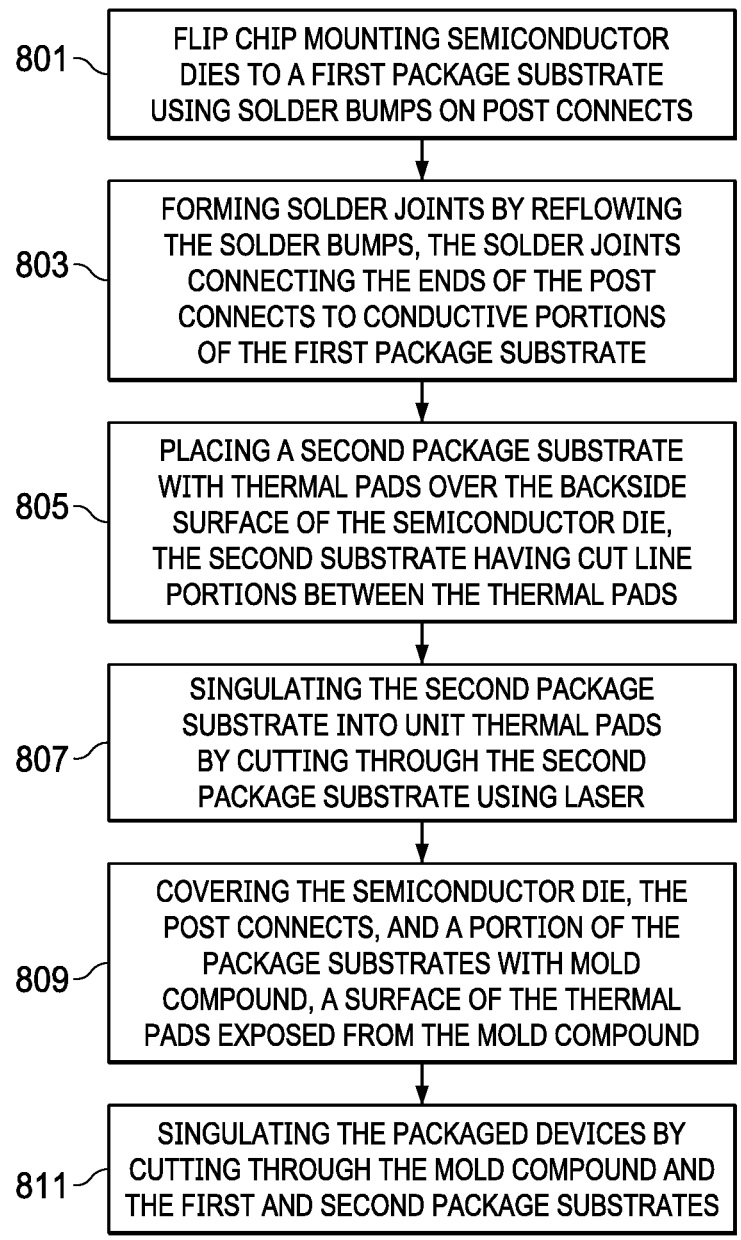
FIG. 8 illustrates in a flow diagram selected steps of a method for forming the arrangements.

FIG. 8 illustrates, in a flow diagram, method steps for forming the arrangements of FIGS. 7A-7H. At step 801, semiconductor dies are flip chip mounted to the top side surface of a first package substrate (see 701 in FIG. 7A). At step 803, a thermal reflow process is performed to form solder joints between the post connects on the semiconductor dies to the top side surface of the package substrate (see solder joints 111 in FIG. 7B). At step 805, a second package substrate is positioned over the backside surface of the semiconductor dies and is attached to the backside surface of the semiconductor dies (see 705 in FIG. 7C, FIG. 7D). At step 807, the second package substrate is singulated into thermal pad units that are attached to the semiconductor devices by cutting through cut lines using, for example, a laser cutting tool (see 709 in FIG. 7D, thermal pad 721, in FIGS. 7E-7G.) At step 809, the semiconductor devices, the post connects, the first package substrate and the thermal pads are encapsulated by mold compound, portions of the thermal pad and portions of the first package substrate remain exposed from the mold compound (see 103 in FIG. 7F). At step 811, the packaged devices are singulated from one another by cutting through the mold compound 103 and the package substrate at saw streets, portions of the first package substrate forming leads for the packaged devices (see FIGS. 7G, 7H). The top side surface of the packaged devices includes an exposed surface of the thermal pads to provide thermal dissipation.

Modifications are possible in the described arrangements, and other alternative arrangements are possible within the scope of the claims.

What is claimed is:

1. An apparatus, comprising:
 a first package substrate having a die mount surface;
 a semiconductor die flip chip mounted to the first package substrate on the die mount surface, the semiconductor die having post connects having proximate ends on bond pads on an active surface of the semiconductor die, and extending to distal ends away from the semiconductor die and connected to the first package substrate by solder joints;
 a second package substrate having a thermal pad positioned with the thermal pad over a backside surface of the semiconductor die; and
 mold compound covering a portion of the first package substrate, a portion of the second package substrate, the semiconductor die, and the post connects, the thermal pad having a surface exposed from the mold compound, wherein the second package substrate is freestanding within the package only attached to the mold compound.

2. The apparatus of claim 1, and further comprising leads formed from the first package substrate and extending from the mold compound.

3. The apparatus of claim 2, wherein the leads are shaped to extend alongside a portion of a package body formed by the mold compound, the leads having end portions configured for surface mounting to a circuit board.

4. The apparatus of claim 1, wherein the exposed surface of the thermal pad is configured for surface mounting to a circuit board.

5. The apparatus of claim 1, wherein the second package substrate comprises one of copper and copper alloys.

6. The apparatus of claim 1, wherein the first package substrate comprises one of copper and copper alloys.

7. The apparatus of claim 1, wherein the solder joints further comprise solder that is one selected from lead solder and lead-free solder.

8. The apparatus of claim 7, wherein the solder joints further comprise lead-free solder that includes tin and silver.

9. The apparatus of claim 7, wherein the solder joints further comprise lead-free solder that includes tin, silver and copper.

10. The apparatus of claim 1, wherein the first package substrate is a metal lead frame.

11. The apparatus of claim 10, wherein the metal lead frame further comprises one selected from copper, stainless steel, steel, alloy 42, and alloys thereof.

12. The apparatus of claim 1, wherein the first package substrate and the second package substrate comprise only metal.

13. An apparatus, comprising:
 a packaged device having conductive leads and a thermal pad exposed from a mold compound, wherein the packaged device further comprises:
 a first package substrate having a die mount surface;
 a semiconductor die flip chip mounted to the first package substrate on the die mount surface, the semiconductor die having post connects coupled to the first package substrate by solder joints;
 a second package substrate having the thermal pad positioned with the thermal pad over a backside surface of the semiconductor die; and
 mold compound covering a portion of the first package substrate, a portion of the second package substrate, the semiconductor die, and the post connects, thermal pad having a surface exposed from the mold compound, wherein the second package substrate is freestanding within the package only attached to the mold compound, and wherein the first package substrate and the second package substrate comprise metal.

14. The apparatus of claim 13, wherein the semiconductor die is spaced from the thermal pad by mold compound.

15. The apparatus of claim 13, wherein the semiconductor die is physically contacting the thermal pad.

16. The apparatus of claim 13, wherein the packaged device is a leaded package, and the leads extend from a body of the packaged device.

17. The apparatus of claim 13, wherein the packaged device is a no-lead package, and the leads are coextensive with a body of the packaged device.

18. The apparatus of claim 13, wherein the semiconductor die includes proximate ends on bond pads on an active surface of the semiconductor die, and extending to distal ends away from the semiconductor die.

19. The apparatus of claim 13, wherein the thermal pad includes a thermally conductive material.

\* \* \* \* \*